April 9, 1968 H. WEISS 3,377,529

SEMICONDUCTOR DEVICE WITH ANISOTROPIC INCLUSIONS FOR PRODUCING ELECTROMAGNETIC RADIATION

Filed Oct. 4, 1965

2 Sheets-Sheet 1

United States Patent Office 3,377,529

Patented Apr. 9, 1968

3,377,529

SEMICONDUCTOR DEVICE WITH ANISOTROPIC INCLUSIONS FOR PRODUCING ELECTROMAGNETIC RADIATION

Herbert Weiss, Nurnberg, Germany, assignor to Siemens Aktiengesellschaft, Berlin, Germany, a corporation of Germany Filed Oct. 4, 1965, Ser. No. 492,588
9 Claims. (Cl. 317—237)

ABSTRACT OF THE DISCLOSURE

Device for producing electromagnetic radiation includes a semiconductor body comprising a semiconductor material, a pair of conductive plates respectively adjacent opposite ends of the semiconductor body and adapted to have a voltage applied therebetween and a plurality of anisotropic substantially needle-shaped relatively good electrical conductivity inclusions contained in the semiconductor body, the inclusions being disposed in substantially parallel spaced relationship and aligned substantially perpendicularly to the surfaces of the plates and forming barrier contacts between the inclusions and the semiconductor material whereby upon application between the plates of a unidirectional voltage of a given polarity, opposite conductivity type charge carriers are injected into the semiconductor material at the respective ends of the inclusions, the charge carriers combining to produce the resulting emission of radiation and whereby upon reversing of the applied voltage polarity, the charge carriers are injected in reverse types at the ends of the inclusions into the semiconductor material and combine to produce the resulting emission of radiation.

Figure 1:
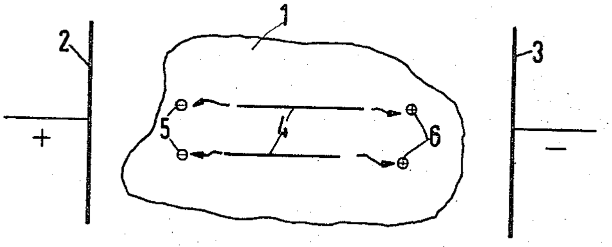

My invention relates to devices for producing electromagnetic radiation. More particularly, it relates to such devices which comprise a semiconductor body.

Semiconductor bodies, particularly semiconductor crystals which have incorporated therein eutectic structural components which are relatively good electrical conductivity and which are arranged in the bodies to be parallel to each other and to provide geometric anisotropy within the semiconductor bodies, are known and have, for example, been described in "Zeitschrift für Physik," vol. 176, 1963, on pages 399–408. The material comprising such semiconductor bodies may suitably be described as having two "phases" in which one of the phases constitutes the semiconductor material and the other of the phases constitutes the material of which the anisotropic components are composed. The latter components may suitably have the form of needles whose longitudinal axes are respectively parallel to each other.

This invention is based upon the principle that, if these good conductivity components, which may suitably be termed anisotropic inclusions in the semiconductor body, are connected at one of their ends with an external barrier contact, they form together with such contact a multiple point contact arrangement. Now, if a voltage is appropriately applied to such multiple point contact anisotropic inclusion containing semiconductor body, an electric field is produced therein whose intensity is particularly great at the pointed ends of the inclusions. With the employment of an applied voltage that is not of a relatively high magnitude, charge carriers are injected into the semiconductor body substantially only at the points of the inclusions, possibly due to the quantum-mechanical tunnel effect. The carrier injection results from the barrier effect of the external contact and of the inclusions connected thereto.

According to the invention, a device is provided in which a two-phase element comprising a semiconductor material body as one of the phases and having therein elongated pointed parallel aligned anisotropic inclusions which are comprised of a good electrical conductivity material as the other of the phases therein, is arranged in an electric field having a direction which is essentially parallel to the longitudinal axes of the inclusions. The contact between the inclusions and the semiconductor material is a barrier contact. Conveniently, the semiconductor body may be made in the form of a flat plate with the anisotropic inclusions therein disposed in plane parallel to the plane of such plate.

In one embodiment constructed according to the invention, the semiconductor body is "high-ohmic" and is disposed between two capacitor plates such that the inclusions lie essentially perpendicular to the respective surfaces of these plates. The term "high-ohmic" semiconductor body is intended to signify a self-conducting or weakly doped semiconductor body. The electrical conductance capability of the inclusions, made from a good conductivity material, is high compared to the electrical conductance capability of the semiconductor body. The inclusions are disposed substantially parallel to each other within a deviation of about 10 to 20°.

Further and in accordance with the invention, the device for producing electromagnetic radiation may be so constructed that the semiconductor body is provided with external contacts of which, at least, one is a barrier contact against the semiconductor body but is in ohmic contact with one pointed end of each of the inclusions respectively.

The above described semiconductor devices may find application in situations where a multiple point contact with the semiconductor body is required such as in a multiple point rectifier, for example. These semiconductor devices are particularly suitable for producing electromagnetic radiation in the infrared and visible spectral regions. In the semiconductor device having a multiple point contact and functioning for these foregoing purposes, i.e., multiple point rectifier and electromagnetic radiation producer, the semiconductor material phase which surrounds the elongated pointed inclusions which make electrical connectionw ith the external contacts has to be of a "high-ohmic" nature as defined hereinabove.

The semiconductor material phase of the devices constructed according to the invention may suitably comprise $A^{III}B^{V}$ materials wherein $A^{III}$ and $B^{V}$ are elements of the III and V groups respectively of the periodic table of elements. Such materials, for example, may be indium antimonide, indium arsenide, gallium antimonide, gallium arsenide, or gallium phosphide. The semiconductor material phase may also suitably comprise $A^{II}B^{VI}$ materials wherein A and B are elements of the II and VI groups respectively of the periodic table of elements, such materials suitably being, for example, zinc sulfide or cadmium sulfide.

The anisotropic good electrical conductivity inclusions in the semiconductor body may suitably be needle-shaped or of elongated pointed oval shape. To provide such inclusions in the semiconductor bodies, a suitably advantageous procedure is to employ quasi-binary systems in the production of these bodies. In such employment, an element or compound precipitates within the semiconductor material from the melt thereof in needle-like shape during the solidification of the melt. Examples of quasi-binary systems are, for example, indium antimonide/nickel antimonide, indium antimonide/chromium antimonide, indium antimonide/iron antimonide, indium antimonide/manganese antimonide, indium arsenide/chromium arsenide, indium arsenide/iron arsenide, indium arsenide/cobalt arsenide, gallium antimonide/chromium antimonide, gallium antimonide/iron gallium, gallium antimonide/cobalt gallium, gallium arsenide/ chromium arsenide, and gallium arsenide/molybdenum arsenide. The salient advantage of the use of such quasi-binary systems lies in the fact that there is enabled thereby the parallel aligning of the precipitated inclusions in needle form along a great portion of the length of the semiconductor crystal body. Such alignment may be effected, for example, by aligned solidification or by zone-melting. In semiconductor materials characterized by relatively narrow bandwidth such as indium antimonide or indium arsenide, for example, there is necessary the cooling of the semiconductor body to a temperature approximately that of liquid air to produce barrier contacts having adequately high electrical resistance. In some circumstances, the semiconductor body may also have to be re-doped. The good electrical conductivity anisotropic inclusions may be distributed within the entire semiconductor body or only within a portion thereof.

Semiconductor devices with multiple point contacts may be constructed in arrangements such that the semiconductor material of the semiconductor bodies respectively containing the inclusions is not present near the ends of the inclusions whereby the pointed ends of the inclusions protrude from the semiconductor bodies. With such arrangement, external contacts may be placed in good electrical contact with the ends of the inclusions. To effect such arrangement, an inclusion containing semiconductor body may be sectioned approximately perpendicularly to the lines of disposition of the inclusions. Thereafter, the sectioned plane is ground and etched until the point ends of the inclusions extend freely from the semiconductor material.

In comparison to point contact devices wherein the point contacts are externally forced into a semiconductor body, the multiple point contact device resulting from the presence of good conductivity inclusions in the semiconductor body, as constructed in accordance with the principles of the invention, presents many advantages. Among these advantages are the fact that the inclusions utilized to form the point contacts may be provided in the semiconductor body during its fabrication in a definite arrangement, and with a chosen density. Consequently, the possibility of impairment of the crystal structure of the semiconductor body caused by subsequent application thereto of point contacts is eliminated.

Generally speaking and in accordance with the invention, there is provided a device for producing electromagnetic radiation comprising a semiconductor body comprising a semiconductor material. A pair of conductive plates are provided respectively adjacent the opposite ends of the semiconductor body which are adapted to have a voltage applied therebetween. In the semiconductor body, there are included a multiplicity of anisotropic substantially needle-shaped relatively good electrical conductivity inclusions, the inclusions being disposed in substantially parallel spaced relationship and aligned substantially perpendicularly to the surfaces of the plates. Upon the application between the plates of a unidirectional voltage of a given polarity, opposite conductivity type charge carriers are injected into the semiconductor material at the respective ends of the inclusions, the charge carriers combining to effect a resulting emission of radiation, the reversing of the aforesaid given voltage causing the injection of the charge carriers to be injected in reverse types at the ends of the inclusions into the semiconductor material, the charge carriers again combining, with the resulting emission of the electromagnetic radiation.

The foregoing and more specific objects of my invention will be apparent from and will be mentioned in the following description of a device for producing electromagnetic radiation according to the invention taken in conjunction with the accompanying drawings.

Figure 2:
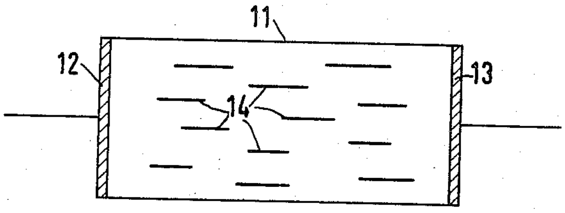
Figure 3:
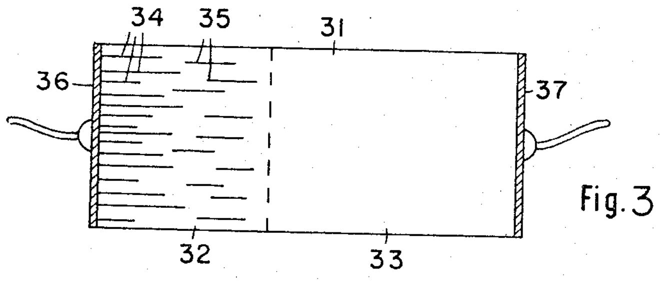
Figure 4:
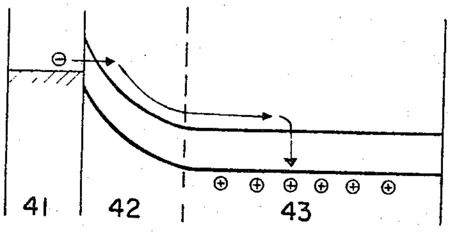
Figure 5:
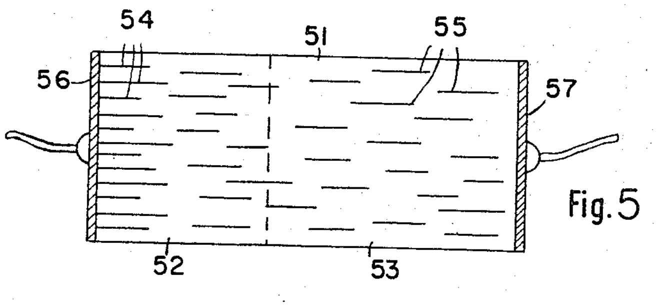
Figure 6:
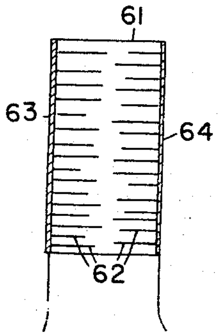

In the drawing:

FIG. 1 schematically shows a device constructed in accordance with the principles of the invention which illustrates the inventive concept;

FIG. 2 is a schematic depiction, partly in section of a specific illustrative embodiment of a device made according to the invention;

FIG. 3 schematically shows another embodiment of the invention which provides a multiple point contact device;

FIG. 4 comprises a group of curves which is conveniently utilized in explaining the operation of the device of FIG. 3;

FIG. 5 is a schematic diagram of a device which is a modification of the device shown in FIG. 3; and FIG. 6 is a schematic depiction of another embodiment of a device constructed in accordance with the principles of the invention.

Referring now to FIG. 1 wherein there is shown an illustrative embodiment of a semiconductor device constructed in accordance with the principles of the invention, numeral 1 designates a "high-ohmic" semiconductor body which is disposed between the metallic plates 2 and 3, body 1 and plates 2 and 3 effectively constituting a capacitor. In semiconductor body 1, there are incorporated needle-shaped good conductivity anisotropic bodies disposed substantially perpendicularly to the planes of the surfaces of plates 2 and 3 and in substantially parallel spaced relationship with respect to each other. The numeral 4 designates a pair of these inclusions which may comprise a good conductivity metal or which may be the precipitated phase resulting from the use of a quasi-binary phase material in fabricating semiconductor body 1 as detailed hereinabove.

In the operation of the device shown in FIG. 1, with the application of a relatively low voltage such as about a few volts to capacitor plates 2 and 3, an electrical field is created between these plates. Such field is particularly intense at the point ends of inclusions 4. Consequently and probably because of the quantum-mechanical tunnel effect, charge carriers are injected at the point ends of the inclusions into the high-ohmic semiconductor crystal material of semiconductor body 1 and are caught in traps therein. Thus, if as shown in FIG. 1, plate 2 of the capacitor is positively charged and plate 3 is negatively charged as a result of the voltage applied to plates 2 and 3 in the appropriate polarity, then electrons 5 are injected into the semiconductor material at the points of inclusions 4 opposing plate 2 and holes 6 are injected into the semiconductor material at the points of inclusions 4, opposing plate 3. Now, if the polarity of the electrical field is reversed, electrons 5 may combine with holes 6 with the emission of infrared or visible electromagnetic radiation. Also, with the reversal of the polarity of the applied voltage, holes may now be injected into the semiconductor material at the points of inclusions 4 opposing plate 2 and electrons may be injected into the semiconductor material at the points of inclusions 4 opposing plate 2. Thereafter, with the re-reversal of the applied voltage polarity, a combination of electrons and holes may again take place with a resulting emission of the above described infrared and/or visible electromagnetic radiation and the reinjection of charge carriers at the point ends of inclusions 4, the same as is shown in FIG. 1. Thus, the continual reversing of the polarity of the applied voltage to plates 2 and 3, results, with the device of FIG. 1, in a correspondingly continuous emission of radiation. However, even without the reversing of the applied voltage polarity, charge carriers may also be injected into the semiconductor bodies by inclusions which are series connected approximately in the direction of the application of the electric field and such carriers may also recombine with the resulting emission of electromagnetic radiation.

As mentioned hereinabove, semiconductor body 1 in FIG. 1 comprises a high-ohmic material. Consequently, the capacitor plates 2 and 3 need not be spaced from the semiconductor body as shown in FIG. 1 but may be placed in direct contact therewith without causing a breakdown of the semiconductor material in the electric field caused by electrical conductance phenomena in the semiconductor body. A device wherein the capacitor plates is in contact with the semiconductor body is shown in FIG. 2.

In FIG. 2, numeral 11 designates the high-ohmic semiconductor body, numerals 12 and 13 respectively designates the capacitor plates which are in good physical contact with the ends of semiconductor body 11 and numeral 14 designates the parallel spaced anisotropic inclusions which are disposed substantially perpendicularly to the surfaces of plates 12 and 13. Capacitor plates 12 and 13 may be suitable provided on semiconductor body 11 by such methods, for example, as alloying, vapor deposition and other suitable techniques. Preferably, semiconductor body 11 may be constructed as a relatively thin plate or wafer in order to prevent excessive absorption of the produced electroluminescent radiation in the semiconductor material.

The embodiment of the invention depicted in FIG. 3 is a semiconductor device which comprises a multiplicity of point contacts. Such multiple point contact device comprises a semiconductor body 31 having thereon external electrical contacts 36 and 37. In the region 32 of semiconductor body 31, the semiconductor material is high-ohmic, and in this region, there are included in the semiconductor material, the parallel aligned spaced anisotropic inclusions 34 and 35, disposed substantially perpendicularly to the surface of contact 36. Here again, inclusions 34 and 35 may comprise a good electrical conductivity metal or may be one of the phases of a quasi-binary phase as described hereinabove. Region 33 of semiconductor body 31 may be suitably described as comprising a "low-ohmic" semiconductor material, i.e., it is relatively strongly doped as compared to the weak doping of the semiconductor material comprising region 32. Region 33 may be suitably applied to region 32 in an epitaxial process. The external contact 36 is in good electrical contact with a portion of the needle-shaped inclusions, i.e., inclusions 34 but form a barrier contact with the semiconductor material of region 32. Contact 36 is suitably provided by the vapor depositing thereof on an end surface of region 32 whose plane is substantially perpendicular to the lines of disposition of inclusions 34. Contact 36 alternatively may be alloyed into the aforesaid surface plane of region 32 after such surface has been etched or ground or treated in another suitable manner whereby the point ends of inclusions 34 extend therefrom. The contact of region 33 and contact 37 is essentially barrier free as compared to the contact of the semiconductor material comprising region 32 and contact 36.

In the curves of FIG. 4 which illustrate the operation of the semiconductor device of the invention wherein there is provided a multiplicity of point contacts as depicted in FIG. 3, for convenience of explanation, it is assumed that low-ohmic region 33 in FIG. 3 comprises a semiconductor material of p-type conductivity. Portion 41 in FIG. 4 constitutes the high-ohmic region of section 32 which is adjacent to the point contacts of inclusions 34 and external contact 36. In the operation of the device of FIG. 3, if a direct current voltage of a few volts is applied between contacts 36 and 37 with a polarity such that the negative end is at contact 36, then the Fermi level in high ohmic region 32 is sufficiently reduced whereby an injection of electrons may occur at the points of inclusions 34 into the semiconductor material comprising the high-ohmic region. These electrons then flow into low ohmic region 33 and combine with the holes present in region 33 with a resulting emission of electromagnetic radiation.

The embodiment of the inventive device shown in FIG. 5 comprises a semiconductor body 51 having two external electrical contacts 56 and 57. Needle-shaped good conducting inclusions 54 and 55 are distributed in parallel spaced disposition throughout all of semiconductor body 51, inclusions 54 and 55 being aligned substantially perpendicularly to the planes of contacts 56 and 57. Inclusions 54 are in good electrical contact with external barrier contact 56 similar to the arrangement of inclusions 34 and barrier contact 36 in FIG. 3. Region 52 of semiconductor body 51 which surrounds inclusions 54 comprises a high-ohmic semiconductor material whereas region 53 comprises a low ohmic semiconductor material. Contact 57 is substantially barrier free.

The operation of the device of FIG. 5 is substantially similar to the operation of the device of FIG. 3. Thus, charge carriers are injected at the point contacts into the semiconductor material comprising high-ohmic region 52. These carriers move into low-ohmic region 53 and there combine with charge carriers of the opposite polarity with an emission of electromagnetic radiation. The device shown in FIG. 5 presents the advantage of being simpler to fabricate than the device depicted in FIG. 3.

The semiconductor bodies of the devices shown in FIGS. 3 and 5 are advantageously constructed in the form of thin plates which are provided with electrical contacts at their thin narrower ends. Here again, the advantage presented by making the semiconductor bodies quite thin is the prevention of an undesirably strong absorption of the emitted radiation in the semiconductor material.

In FIG. 6, there is depicted a semiconductor device with a multiplicity of point contacts which comprises a semiconductor body 61 comprising a high-ohmic semiconductor material having two external barrier contacts 63 and 64. Semiconductor body 61 contains good conductivity needle-shaped inclusions which are, in part, in good electrical contact with external contact 63 and in part in good electrical contact with external contact 64, inclusions 62 being of the same nature as of those described in connection with the embodiments of FIGS. 1, 2, 3 and 5 and being in parallel spaced arrangement in lines substantially perpendicular to the surfaces of contacts 63 and 64 respectively. Consequently, the device of FIG. 6 possesses two sets of multiple point contacts. Therefore, charge carriers of different types are injected by the point contacts of both sets into the semiconductor material comprising semiconductor body 61 and recombine with the emission of radiation independently of the polarity of the direct current voltage applied between contacts 63 and 64. Semiconductor body may suitably be constructed as a thin plate which suitably may have a thickness of about 100 to 300$\mu$ where the length of inclusions 62 is chosen to be about 30 to 50$\mu$. If a shorter length is chosen for the inclusions, then the thickness of body 61 may be commensurately shorter. Care has to be taken in the arrangement of the respective sets of inclusions in contact with contacts 63 and 64 to insure that no short circuit occurs therebetween. External contacts 63 and 64 are suitably provided by the vapor deposition thereof in a thin layer on the large area sides of semiconductor body or plate 61 whereby electromagnetic radiation being emitted between the multiple point contact sets may penetrate through contacts 63 and 64.

The wavelength of the electromagnetic radiation emitted during electroluminescence depends upon the forbidden band of the semiconductor material which is used. To obtain radiation in the visible spectrum region, a semiconductor material has to be used which has a forbidden band width exceeding 1.4 ev. Where semiconductor materials are used which have smaller forbidden bandwidth, electromagnetic radiation of the infrared spectral region is obtained.

It will be obvious to those skilled in the art upon studying this disclosure that devices for producing electromagnetic radiation according to my invention permit of a great variety of modifications and hence can be given embodiments other than those particularly illustrated herein without departing from the essential features of my invention and within the scope of the claims annexed hereto.

I claim:

1. A device for producing electromagnetic radiation comprising a semiconductor body comprising a semiconductor material, a pair of conductive plates respectively adjacent opposite ends of said body and adapted to have a voltage applied therebetween and a plurality of anisotropic substantially needle-shaped relatively good electrical conductivity inclusions contained in said semiconductor body, said inclusions being disposed in substantially parallel spaced relationship and aligned substantially perpendicularly to the surfaces of said plates and forming barrier contacts between the inclusions and the semiconductor material whereby upon the application between said plates of a unidirectional voltage of a given polarity, opposite conductivity type charge carriers are injected into said semiconductor material at the respective ends of said inclusions, said charge carriers combining to produce the resulting emission of said radiation and whereby upon the reversing of said applied voltage polarity, said charge carriers are injected in reverse types at said ends of said inclusions into said semiconductor material and combine to produce said resulting emission of said radiation.

2. A device for producing electromagnetic radiation comprising a semiconductor body comprising a relatively high-ohmic semiconductor material, a pair of conductive plates on the respective ends of said body and adapted to have a voltage applied therebetween, and a plurality of anisotropic substantially needle-shaped relatively good electrical conductivity inclusions contained in said semiconductor body, said inclusions being disposed in substantially parallel spaced relationship and aligned substantially perpendicularly to the surfaces of said plates and forming barrier contacts between said inclusions and said semiconductor material whereby upon the application between said plates of a unidirectional voltage of a given polarity, opposite conductivity type charge carriers are injected into said semiconductor material at the respective ends of said inclusions, said charge carriers combining to produce the resulting emission of said radiation and whereby upon the reversing of said applied voltage polarity said charge carriers are injected in reverse types at said ends of said inclusions into said semiconductor material and combine to produce said resulting emission of said radiation.

3. A device as defined in claim 2 wherein said semiconductor material and said inclusions are formed of a quasibinary phase system wherein one phase constitutes said semiconductor material and the other phase constitutes the material of said inclusions.

4. A device as defined in claim 2 wherein said inclusions comprise a relatively good conductivity metal material.

5. A device as defined in claim 3 wherein said quasibinary systems are selected from the group consisting of indium antimonide/nickel antimonide, indium antimonide/chromium antimonide, indium antimonide/iron antimonide, indium antimonide/manganese antimonide, indium arsenide/chromium arsenide, indium arsenide/iron arsenide, indium arsenide/cobalt arsenide, gallium antimonide/chromium antimonide, gallium antimonide/iron gallium, gallium antimonide/cobalt gallium, gallium arsenide/chromium arsenide, and gallium arsenide/molybdenum arsenide.

6. A device for producing electromagnetic radiation comprising a semiconductor body comprising a semiconductor material, a pair of external contacts on opposite ends of said body adapted to have a voltage applied therebetween, a plurality of anisotropic substantially needle-shaped relatively good conductivity inclusions contained in said semiconductor body, said inclusions being disposed in substantially parallel relationship and aligned substantially perpendicularly to said external contacts, one of said contacts being in good ohmic electrical contact with the ends of some of said inclusions and in barrier contact with said semiconductor material.

7. A device for producing electromagnetic radiation as defined in claim 6 wherein said semiconductor body comprises a region adjacent said one contact which comprises a high-ohmic semiconductor material and a region between said high ohmic semiconductor material region and said other contact which comprises a low-ohmic semiconductor material.

8. A device for producing electromagnetic radiation as defined in claim 7 wherein said inclusions are all contained in said high-ohmic semiconductor material region.

9. A device for producing electromagnetic radiation comprising a semiconductor body comprising a high ohmic semiconductor material, a pair of external contacts on opposite ends of said body adapted to have a voltage applied therebetween, a plurality of anisotropic, substantially needle-shaped, relatively good conductivity inclusions contained in said semiconductor body, said inclusions being disposed in substantially parallel relationship and aligned substantially perpendicularly to said external contacts, said plurality of inclusions comprising two groups, one end of each of the inclusions in one of said groups being in good electrical contact with one of said contacts, one end of each of the inclusions of the other of said groups being in good electrical contact with the other end of said contacts, the other ends of the inclusions of each of said groups respectively being separated from each other by a barrier layer of said semiconductor material.

References Cited

UNITED STATES PATENTS

| | | | |
|---|---|---|---|
| 2,790,037 | 4/1957 | Shackley | 317—235 |
| 2,940,022 | 6/1960 | Pankove | 317—235 |
| 3,122,655 | 2/1964 | Murray | 317—235 X |
| 3,268,374 | 8/1966 | Anderson | 317—235 X |

JOHN W. HUCKERT, *Primary Examiner.*

JAMES D. KALLAM, *Examiner.*

UNITED STATES PATENT OFFICE
CERTIFICATE OF CORRECTION

Patent No. 3,377,529 April 9, 1968

Herbert Weiss

It is certified that error appears in the above identified patent and that said Letters Patent are hereby corrected as shown below:

In the heading to the printed specification, after line 8, insert -- Claims priority, applications Germany, both filed Oct. 3, 1964, S 93,610 and S 93,613 --.

Signed and sealed this 28th day of October 1969.

(SEAL)
Attest:

Edward M. Fletcher, Jr.
Attesting Officer

WILLIAM E. SCHUYLER, JR.
Commissioner of Patents